United States Patent
Phillips et al.

(10) Patent No.: US 7,898,301 B2
(45) Date of Patent: Mar. 1, 2011

(54) ZERO INPUT CURRENT-DRAIN COMPARATOR WITH HIGH ACCURACY TRIP POINT ABOVE SUPPLY VOLTAGE

(75) Inventors: James B. Phillips, Lake Geneva, IL (US); Alan L. Ruff, Belvidere, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 356 days.

(21) Appl. No.: 12/053,250

(22) Filed: Mar. 21, 2008

(65) Prior Publication Data

US 2009/0237118 A1   Sep. 24, 2009

(51) Int. Cl.
*H03K 5/22* (2006.01)
(52) U.S. Cl. .............................. 327/77; 327/80; 327/81; 327/83
(58) Field of Classification Search .................... 327/63, 327/65, 77, 78, 80, 81, 83, 307
See application file for complete search history.

(56) References Cited

U.S. PATENT DOCUMENTS

| | | | |
|---|---|---|---|
| 4,071,783 A * | 1/1978 | Knepper | 326/87 |
| 6,081,140 A * | 6/2000 | King | 327/77 |
| 6,801,059 B2 * | 10/2004 | Lee | 327/65 |
| 2005/0184761 A1 | 8/2005 | Isomura | |
| 2005/0184798 A1 | 8/2005 | Higemoto et al. | |
| 2005/0218938 A1 | 10/2005 | Sugano | |

\* cited by examiner

*Primary Examiner*—Long Nguyen
(74) *Attorney, Agent, or Firm*—Vedder Price P.C.

(57) ABSTRACT

A comparator circuit (300) has a first field effect transistor (FET) (307) with a supply voltage (301) connection and a diode connected FET (303) connected in series to form the first circuit leg of the comparator (300). A second diode connected FET (309) and a second FET (305) in series form the second circuit leg. The first FET (307) and said second FET (305) are approximately equal sized FETs. Another embodiment is an integrated circuit (401) with two n-channel FETs. A first diode connected FET (303) is connected to the first n-channel FET (307) in series to form the first circuit leg of a comparator (300) and a second diode connected FET (309) is connected to a second n-channel FET (305) in series to form the second circuit leg of the comparator. The two n-channel FETs that form the differential pair are approximately equal in size. The trip point is high with respect to the supply voltage.

20 Claims, 5 Drawing Sheets

200

ZERO INPUT CURRENT-DRAIN COMPARATOR WITH HIGH ACCURACY TRIP POINT ABOVE SUPPLY VOLTAGE

FIELD OF THE DISCLOSURE

The present disclosure is generally related to electronic devices and integrated circuits (ICs), and is more specifically related to comparator circuits and/or differential pair circuits.

BACKGROUND

Various electronic devices are capable of forming connections with other electronic devices to act as peripherals or to otherwise transfer information, or power (such as in the case of charging batteries). The port to which an electronic device connects to another electronic device may be a common port where the common port is multifunctional and may be used for various purposes. For example, the port may be used to charge the device, but may also be used for transmitting or receiving information. Therefore, an electronic device having such a common port needs to be capable of distinguishing what type of device is being connected, or is already connected, at the common port, so that internal switching may be applied if needed to operate the connected device, or to facilitate proper operation between the electronic device and the connected device.

The determination of a connected device type may be accomplished by using a circuit such as a comparator that checks a voltage level on a connector pin of a connector port and compares that voltage to a reference voltage. The reference voltage may be, for example, the electronic device supply voltage. The voltage check may be viewed as either checking a connector port pin of the electronic device itself, after being placed in contact with, and therefore electrically connected to, an external device connector port, or may be viewed as checking an output pin of the external connected device, because the external device, via a suitable output connector, is in electrical contact with the electronic device connector port, but is not yet connected to any other electronic device internal circuitry. As would be understood by one of ordinary skill, the connector that is the "input" or "output" is relative to the specific function the devices will be performing with respect to each other.

In some cases the voltage that must be detected on the connector pin exceeds the reference voltage, which may be the supply voltage, and this may cause accuracy concerns for the comparison circuit employed for this purpose. Most importantly, the comparison circuit must not draw current from the input voltage source, as this could, among other things, cause damage to the circuit when the voltage is significantly higher than the supply voltage. Further with regard to accuracy, it may be difficult to discern a given voltage threshold that is significantly higher than the reference voltage as the range of voltage threshold that must be detected may exceed the circuit capability in general.

The accuracy of detection is thus dependent upon the comparator circuit or circuitry employed for this purpose. A known technique used to detect a voltage above the supply rail is to use a resistive voltage divider to divide down the input source voltage below the supply rail so that it can be compared to an available reference voltage using a comparator circuit. However, this does not adequately address the problem because the voltage divider will source an undesirable amount of current from the input voltage source, which is not acceptable as discussed.

Another known approach for detecting a voltage above a supply rail is illustrated by FIG. 1. The circuit shown in FIG. 1 is known as a "lopsided" comparator 100, which may be constructed using transistors or field effect transistors (FETs) to form a differential circuit, also referred to as a differential pair, for example using FET 103 and FET 105. The circuit shown in FIG. 1 is therefore also known as a "lopsided" differential pair because, for example FET 105 may be on the order of ten times larger than FET 103.

The lopsided comparator 100 (or lopsided differential pair 100) provides a trip point at voltage high above the reference voltage 101 as required. Because the input FET 103 (which may be, for example, a depletion type n-channel MOSFET) is much smaller than the reference FET 105, the input voltage must be pulled significantly higher than the reference voltage 101 to reach the trip point. The lopsided comparator also includes the two diode-connected FETs 107 and 109 which act as offset voltage circuits to the differential pair formed by FET 103 and FET 105. A current source circuit 111 connected to ground 113 is also present and may be implemented using any appropriate component or circuit.

The lopsided comparator 100 does provide a trip point above the supply voltage 101 with zero input current drain from the input source without the need for a resistive voltage divider. However several accuracy issues exist. A first issue is that the reference voltage 101, being the supply voltage, can vary by as much as ±4% in a typical application. Second, the amount by which the input voltage needs to be pulled higher than the reference voltage 101 to trip the comparator 100 varies significantly over IC fabrication processes and temperature extremes. For example processes such as percentage doping, gate oxide thickness and device geometry variation may adversely effect the trip point. This issue may thus cause yield problems during IC production and testing. Further, "lopsiding" the differential pair forces use of the supply voltage as the reference voltage 101. However in practice a supply voltage is inaccurate and therefore the comparator trip point required may not be achieved due to variations which may be as small as tenths of a volt.

DETAILED DESCRIPTION

Briefly, a comparator circuit is disclosed having a first field effect transistor (FET) having a voltage input at its gate terminal and a connection for a supply voltage at a first current terminal. A first offset voltage circuit is connected to the first FET in series to form the first circuit leg of the comparator circuit. A second offset voltage circuit is connected to the supply voltage and connected to a second FET in series, to form the second circuit leg of the comparator circuit. The first FET and the second FET form a differential pair of the comparator and are approximately equal sized FETs.

Another embodiment is an integrated circuit having a first n-channel FET with the comparator voltage input at its gate terminal, and a connection for a supply voltage at a current terminal. A first diode connected FET is connected to the first n-channel MOSFET in series to form the first circuit leg of a comparator. A second diode connected FET has a connection for the supply voltage and is connected to a second n-channel FET in series to form the second circuit leg of the comparator. The two n-channel FETs that form the differential pair are approximately equal in size.

A method of fabricating a circuit is also disclosed including providing a first FET having a voltage input at the FET gate terminal, and a connection for a supply voltage, providing a first offset voltage circuit connected to the first FET in series, the first FET and the first offset voltage circuit forming a first circuit leg, providing a second offset voltage circuit having a connection for the supply voltage, and providing a second FET coupled to the second offset voltage circuit in series, the second FET and second offset voltage circuit forming a second circuit leg, where the second circuit leg is connected to the first circuit leg in parallel to form a parallel circuit, where the first FET and the second FET are approximately equal in size and form a differential pair via the parallel circuit. A current source circuit is provided in series with the differential pair and connected to ground at its other end.

In a method of fabricating an integrated circuit, the first FET and the second FET may be depletion type n-channel MOSFETs and the first offset voltage circuit and second offset voltage circuit may be diode connected MOSFETs and in some embodiments may be diode connected depletion type p-channel MOSFETs.

Figure 2:
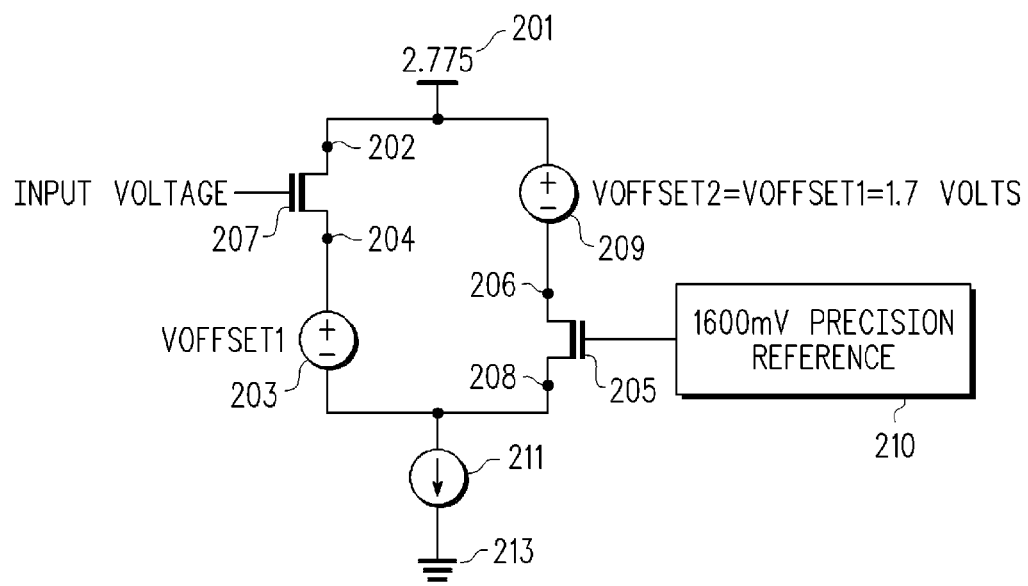
FIG. 2 is a schematic diagram of a comparator circuit of one embodiment of the present invention.

Turning to FIG. 2, a schematic diagram illustrates a comparator circuit of the embodiments. A comparator 200 includes the differential pair FETs 207 and 205, and offset voltage circuits 203 and 209. The FETs may be, for example Metal Oxide Semiconductor FETs (MOSFETs) in some embodiments or may be either discrete components or elements contained within an integrated circuit (IC) structure using any appropriate technology for example, CMOS in some embodiments. Further in some embodiments the various MOSFETs may be a combination of n-channel MOSFETs and p-channel MOSFETs. Depletion type n-channel and depletion type p-channel MOSFETs may also be used in some embodiments.

The voltage source 201, in the case of an IC structure, will be supplied to the comparator 200 via a supply rail, which in an embodiment is a voltage supply conductor running along an appropriate layer of the IC and at an appropriate position with respect to the comparator 200. The input voltage, is received from an external device which is connected to the gate terminal of FET 207 as will be described subsequently herein.

The differential pair FETs 207 and 205 are connected with corresponding offset voltage circuits 203 and 209, respectively, to accurately raise the comparator 200 trip point far above the voltage source 201 as required and further to do so with the desired accuracy. The trip point output is detected by mirroring the currents of the differential pair and using amplifiers via known output stage circuitry. The differential pair FETs 207 and 205 are approximately the same size, unlike the FETs 103 and 105 of the known lopsided comparator 100 shown in FIG. 1. For example, the FET 207 is approximately the same length and width in microns as FET 205 within a tolerance of about 3%.

A current terminal 204 of the FET 207 is connected in series as shown with the offset voltage circuit $V_{offset1}$ 203, which is then connected to the current source circuit 211 which is connected to ground 213. The FET 207 current terminal 202 is connected to the voltage source 201. The second circuit leg of the differential circuit, forming comparator 200, begins with a second offset voltage circuit $V_{offset2}$ 209 connected to voltage source 201 and in series with FET 205, connected to FET 205 current terminal 206. FET 205 current terminal 208 is then connected to the current source circuit 211 which is connected to ground 213.

As may be observed from FIG. 2, one offset voltage circuit 209 is placed above a differential pair FET 205, while the other offset voltage circuit 203 is placed below a FET 207. This positioning effectively adds the controlled offset and allows a higher order matching of the comparator elements.

Figure 1:
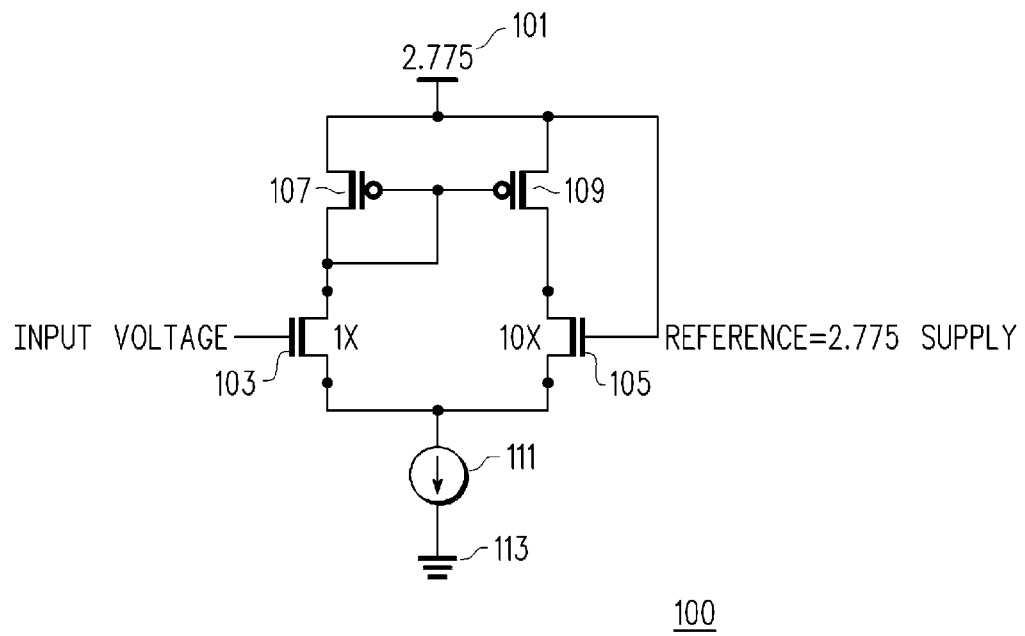
FIG. 1 is a schematic diagram of a known "lopsided" comparator circuit used for detecting a voltage threshold above a supply rail voltage.

Thus the comparator 200 disclosed and shown in FIG. 2, has several advantages over the known comparator 100 illustrated in FIG. 1. By using offset voltage circuits 203 and 209 that are cross coupled, an offset trip point can be produced that is much more accurate than the lopsided differential pair of comparator 100. For example, among other advantages, the position of the offset voltage circuits 203 and 209 helps to reduce gradients that may occur across the surface of the integrated circuit wafer.

Also, with respect to the comparator 200, because the voltage offsets can be made very large, a precision reference may be used, for example, from a trimmed precision reference voltage circuit 210, thereby improving accuracy even further. The trimmed precision reference voltage circuit 210, connected to the gate terminal of FET 205, may be a primary band-gap circuit of an IC in some embodiments.

Figure 3:
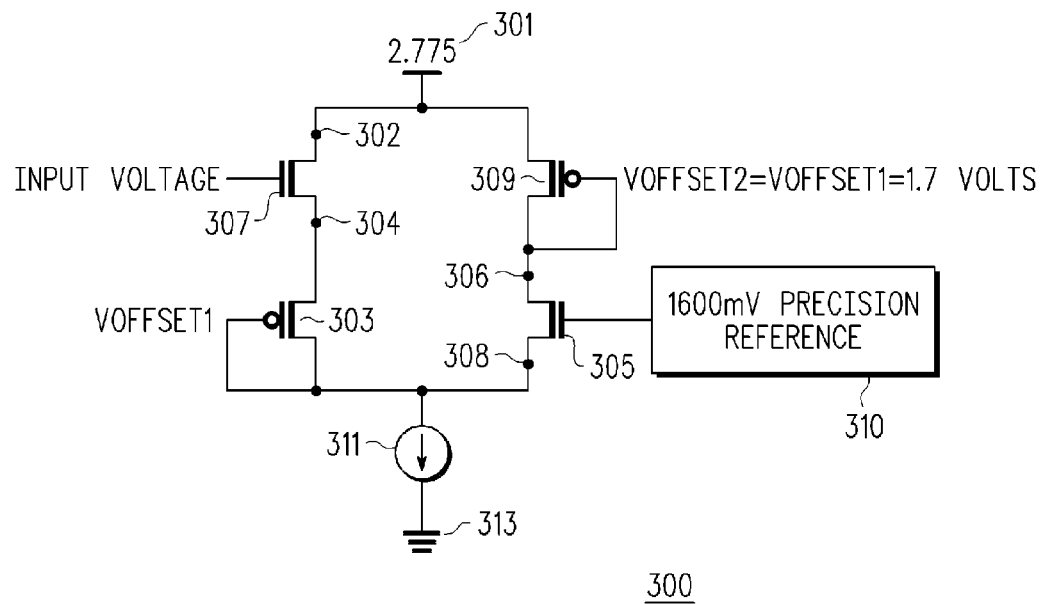
FIG. 3 is a schematic diagram of a comparator circuit of an embodiment of the present invention.

FIG. 3 is a schematic diagram of one embodiment of the circuit illustrated in FIG. 2. To realize the offset voltage circuits 203 and 209, diode-connected FETs 303 and 309 are employed as shown in FIG. 3. A diode connected FET is a FET that, for example, may have its gate terminal connected to its drain terminal. However, various embodiments may use various components such as, but not limited to, a diode, a p-channel FET, an n-channel FET, a bi-polar junction transistor, etc., or combinations thereof, appropriately configured to act as offset voltage circuits 203 and 209. The diode-connected FETs 303 and 309 of the exemplary embodiment illustrated by FIG. 3 are p-channel MOSFETs, however, n-channel MOSFETs may be used in some embodiments with appropriate configuration for current flow as mentioned. In some embodiments, the diode-connected FETs 303 and 309 may be depletion type p-channel MOSFETs. The FETs of the differential pair, FET 307 and FET 305 may be n-channel MOSFETs in the illustrated embodiment and may also be depletion type n-channel MOSFETs in some embodiments.

Figure 4:
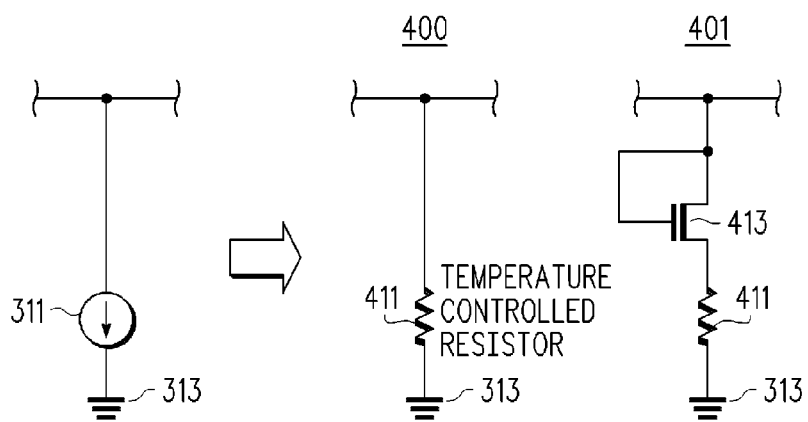
FIG. 4 is a schematic diagram of two current source circuit embodiments of the present invention.

Furthermore, the current source circuits 211 and 311 of the comparators 200 and 300 may be realized using a resistor 411 as shown in FIG. 4 in some embodiments. The resistor 411 is a temperature controlled resistor and may be an n-well resistor or an n-well resistor in combination, for example in series, with a depletion type FET 413 where the n-well resistor and FET 413 have opposite temperature coefficients. Further, the overall temperature coefficient of the bias current may be adjusted during design to cancel out the temperature coefficients of the diode-connected FETs 303 and 309. Simulations have shown that the comparator 300 of the embodiments may achieve approximately a 4 times improvement in trip point accuracy over the known comparator 100.

Thus in FIG. 3, a first FET 307 current terminal 302 is connected to a voltage source 301, and further connected to diode connected FET 303 via FET 307 current terminal 304. The second circuit leg is formed by diode connected FET 309, connected to the voltage source 301 and connected to the FET 305 at FET 305 current terminal 306. The FET 305 at current terminal 308 is connected to the current source circuit 311.

FIG. 4 illustrates two embodiments of the current source circuit 311 and also the current source circuit 211. In one current source circuit embodiment 400, a temperature controlled resistor 411 is utilized. In a second current circuit embodiment 401 a diode connected FET 413 is connected in series with the temperature controlled resistor 411. The diode connected FET 413 has an opposite temperature coefficient to the temperature controlled resistor 411. The temperature controlled resistor 411 may be an n-well resistor in some embodiments.

Other embodiments may realize the current source circuits 211 and 311 in various ways for example, a diode, a diode connected FET, a diode connected depletion type p-channel MOSFET, and a bi-polar junction transistor (BJT), etc. may be used individually or in combination to realize the current source circuits 211 and 311.

Figure 5:
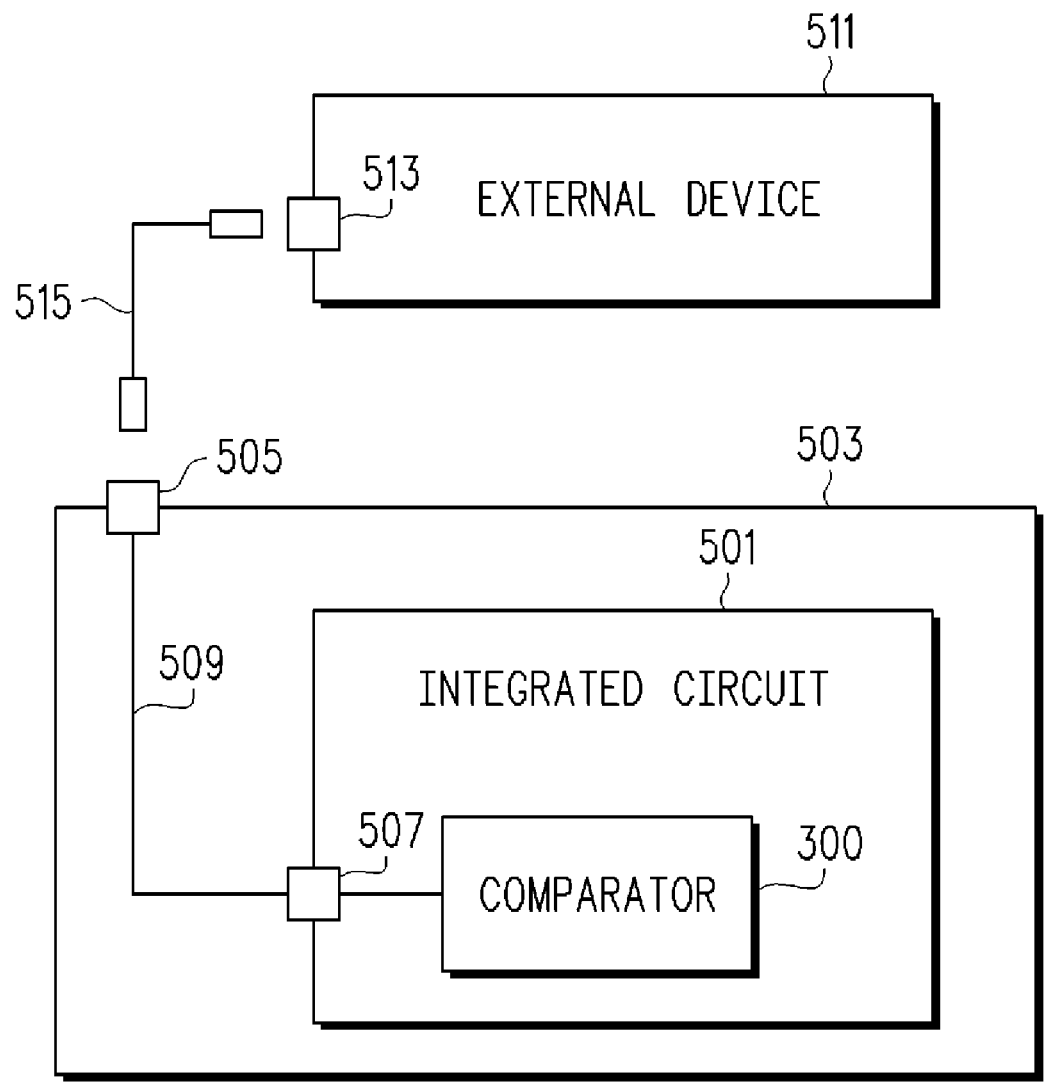
FIG. 5 is a block diagram of an electronic device of an embodiment of the present invention having the comparator circuit shown in FIG. 3.

FIG. 5 illustrates an embodiment employing the comparator 300 for device recognition. It is to be understood that all of the schematic diagrams shown in the FIGs. provided are exemplary only and that other components may be added in order to implement the comparator disclosed herein and to use it in conjunction with other circuitry, for example, other circuitry contained within an electronic device such as electronic device 503 in FIG. 5. Any such additions or connections would be understood by one of ordinary skill in the art and yet would remain in accordance with the embodiments of the present disclosure. Further, any numerical values, such as, but not limited to, source voltages, supply voltages etc. that are shown in the FIGs. are exemplary only and for the purpose of explanation only so that one of ordinary skill may make and use the herein disclosed embodiments. Therefore, any suitable modifications may be made to the examples herein disclosed to render the embodiments as suitable for an application and such suitable modifications therefore remain within the scope of the embodiments herein disclosed.

In FIG. 5, the comparator 300 may be a circuit using discrete elements as discussed previously, or may be implemented as an integrated circuit, or may be contained as a portion of a larger integrated circuit having various other circuits and/or various other components. FIG. 5 illustrates an embodiment where the comparator 300 is on an integrated circuit 501. The integrated circuit 501 is contained within the components and circuitry of an electronic device 503.

Further, the comparator 300 may be a component circuit in a larger device comparison circuitry. The device comparison circuitry may also be an individual integrated circuit, or may be a combination of discrete circuit components, and ICs. The device comparison circuitry may also be on the integrated circuit 501 illustrated in FIG. 5.

The integrated circuit (IC) 501 may be any type of suitable IC and may have any suitable purpose for which comparator 300 may serve an appropriate role. For example, IC 501 may be a power management IC in some embodiments, and/or may be used in various devices employing Universal Serial Bus (USB) and/or USB On-the-Go (USB OTG) connections.

Electronic device 503 may be any of various electronic devices, such as, but not limited to, a mobile telephone, PDA, MP3 player, video playing/recording device, laptop computer, desktop computer, or any other suitable electronic device that may establish a connection with an external device, such as external device 511. The electronic device 503 may be connected to the external device 511 for any suitable purpose, such as, but not limited to, providing power, transferring files, proving peripheral device functions, etc. The external device 511 has a connector port 513 which may be, either directly connected to a connector port 505 of the electronic device 503, or connected thereto via a cable 515. The cable 515 may be a USB cable or a USB OTG cable in some embodiments and may have any suitable combination of USB A, USB B, or USB mini AB connectors. Likewise the connectors 513 and 505 may be USB A, USB B or USB mini-AB connectors or any other suitable connector depending on the type of device. Further the electronic device 503 and the external device 511 may be USB OTG Dual-role-devices (DRDs) in some embodiments.

When the external device 511 is connected to electronic device 503 such that the connectors 513 and 505 are in electrical contact, either directly or via a cable such as cable 515, the comparator 300 checks the voltage on a pin, or a conductive portion, of connector 505. The voltage level at the connector 505 allows the comparator 300, and in some embodiments also a device comparison circuitry, to determine the type of device that external device 511 is, and in response, cause some action to occur, such as, but not limited to, a switching action.

As shown in the example embodiment of FIG. 5, the comparator 300 may be connected to a connector 507 of the IC, which may be a pin or a pad. The connector 507 may be further connected to the connector 505 by a connection line 509. As mentioned, connector 505 may be a USB or USB OTG connector, or any other suitable type of connector. In other embodiments, the comparator 300 may be directly connected to the connector 505 without the intermediate connector 507.

Figure 6:
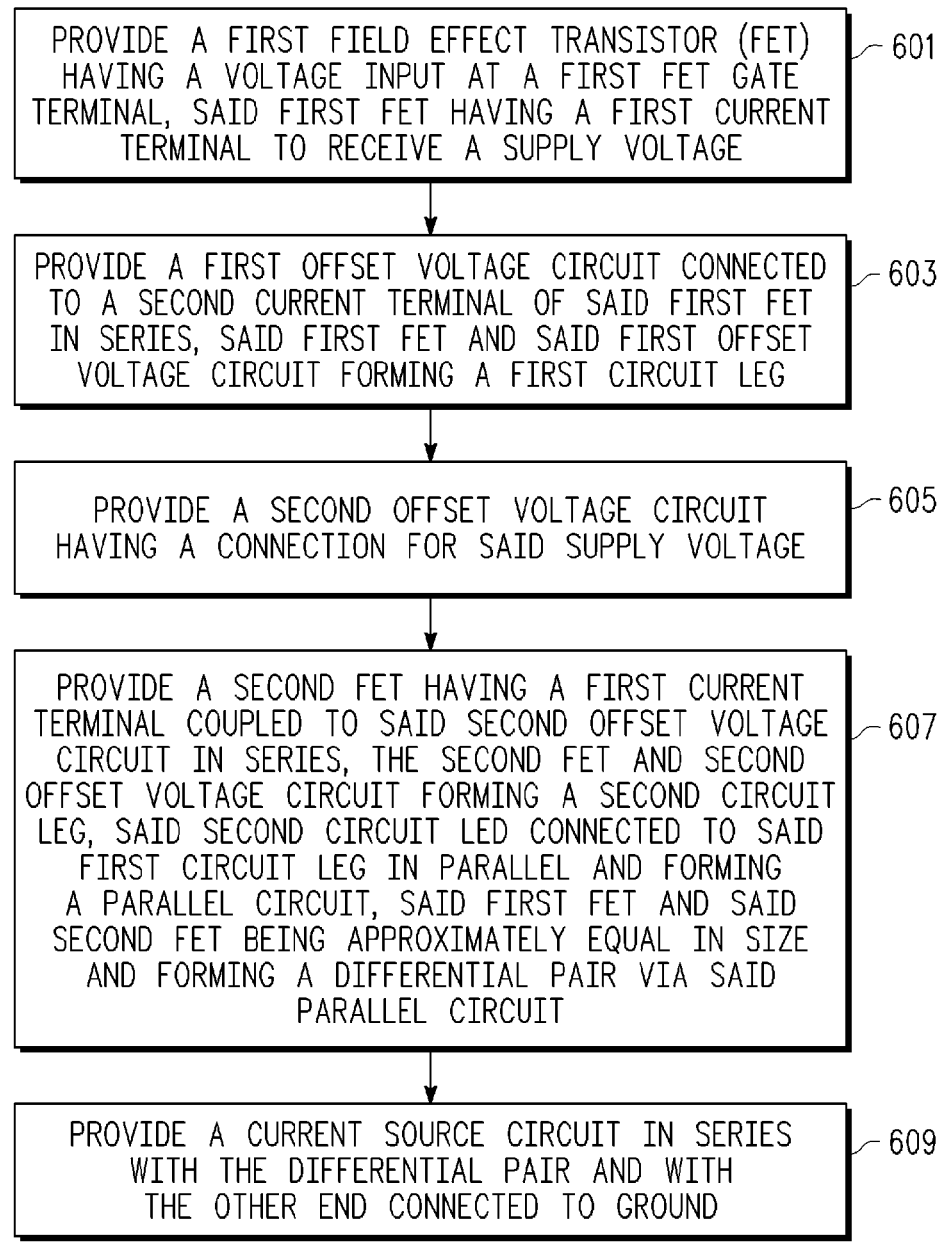
FIG. 6 is a method of fabrication of an integrated circuit of an embodiment of the present invention.

FIG. 6 illustrates a method 600 of fabrication of a circuit as shown in FIG. 2, which may be a circuit utilizing discrete components or may be a circuit on an individual IC or a larger IC having other circuits and/or components which may be connected to the comparator 200 at various points.

The method 600 in 601 provides a first FET 207 having an voltage input at the FET gate terminal, and a connection for a supply voltage 201. In 603, a first offset voltage circuit 203 is provided, connected to the first FET 207 in series, where the first FET 207 and the first offset voltage circuit 203 form a first circuit leg of the comparator 200. In 605, a second offset voltage circuit 209 is provided that has a connection for the supply voltage 201. In 607, a second FET 205 is provided, coupled to the second offset voltage circuit 209 in series, where the second FET 205 and second offset voltage circuit 209 form a second circuit leg of the comparator 200, and where the second circuit leg is connected to the first circuit leg in parallel to form a parallel circuit, where the first FET 207 and the second FET 205 are approximately equal in size and form a differential pair via the parallel circuit. In 609, a current source circuit 211 is provided in series with the first circuit leg and the second circuit leg, that is, the current source circuit is in series with the differential pair.

Figure 7:
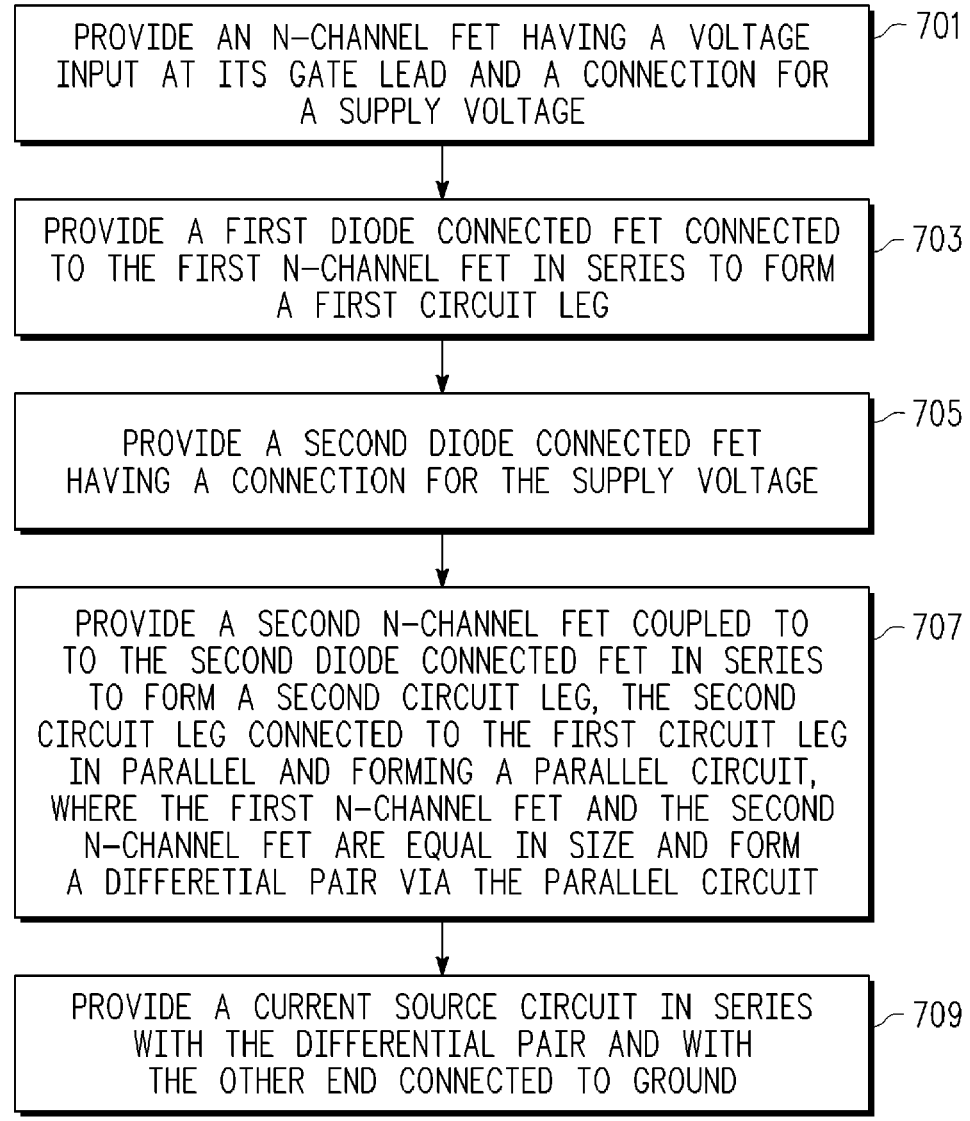
FIG. 7 is a method of fabrication of an integrated circuit of an embodiment of the present invention using n-channel FETs of approximately equal size for forming a differential pair.

FIG. 7 illustrates a method 700 of fabrication of a circuit as shown in FIG. 3, which may be a circuit utilizing discrete components or may be a circuit on an individual IC or a larger IC having other circuits and/or components which may be connected to the comparator 300 at various points. The method 700 exemplifies an embodiment in which n-channel FETs are utilized for the differential pair, and diode connected FETs are used as the offset voltage circuits.

Thus the method 700 begins in 701 where a first n-channel FET, for example FET 307, is provided that has a voltage input at its gate terminal, and a connection for a supply voltage, for example supply voltage 301. In 703, a first diode connected FET 303 is provided connected to said first n-channel FET 307 in series, such that the first n-channel FET 307 and the first diode-connected FET 303 form a first circuit leg. In 705, a second diode connected FET 309 is provided having a connection for the supply voltage 301. In 707, a second n-channel FET 305 is provided coupled to the second diode connected FET 309 in series, such that the second n-channel FET 305 and the second diode connected FET 309 form a second circuit leg. The second circuit leg is further connected to the first circuit leg in parallel to form a parallel circuit where the first n-channel FET 307 and the second n-channel FET 305 are approximately equal in size and form a differential pair via the parallel circuit. In 709, a current source circuit 311 is added is series with the differential pair. The current source circuit 311 may be, for example, a temperature controlled resistor.

It is to be understood that the methods 600 and 700 may be modified to lay the components on the integrated circuit in an order different than that exemplified in the flowcharts of FIG. 6 and FIG. 7, and that any suitable order of providing the components would remain in accordance with the embodiments herein disclosed.

What is claimed is:

1. A circuit comprising a comparator, the comparator comprising:
    a first field effect transistor (FET) having a voltage input at a first FET gate terminal, said first FET having a first current terminal to receive a supply voltage;
    a first offset voltage circuit connected to a second current terminal of said first FET in series, said first FET and said first offset voltage circuit forming a first circuit leg;
    a second offset voltage circuit having a connection for receiving said supply voltage; and
    a second FET having a first current terminal coupled to said second offset voltage circuit in series, the second FET and second offset voltage circuit forming a second circuit leg, said second circuit leg connected to said first circuit leg in parallel and forming a parallel circuit, said first FET and said second FET being approximately equal in size and forming a differential pair via said parallel circuit wherein the voltage input at the first FET gate terminal is uncoupled from a gate terminal of the second FET.

2. The circuit of claim 1, wherein said first offset voltage circuit and said second offset voltage circuit each comprise a component selected from the group of: a diode, a diode connected FET, a diode connected depletion type p-channel MOSFET, and a diode connected bi-polar junction transistor (BJT).

3. The circuit of claim 1, wherein said comparator has a trip point voltage above said supply voltage.

4. The circuit of claim 1, further comprising:
    a current source circuit connected in series with said first circuit leg and said second circuit leg.

5. The circuit of claim 4, wherein said current source circuit is comprised of a temperature controlled resistor.

6. The circuit of claim 5, wherein said temperature controlled resistor is an n-well resistor.

7. The circuit of claim 5, wherein said current source further comprises:
    a depletion type Metal Oxide Semiconductor FET (MOSFET) connected in series with said temperature controlled resistor, said MOSFET having a MOSFET temperature coefficient for canceling out a resistor temperature coefficient of said temperature controlled resistor.

8. The circuit of claim 1, wherein said first FET and said second FET are depletion type n-channel MOSFETs.

9. The circuit of claim 1, wherein said second FET includes a reference voltage input at the second FET gate terminal wherein said reference voltage input is different from said supply voltage.

10. The circuit of claim 1, wherein said circuit is a component circuit of an integrated circuit.

11. An integrated circuit including a comparator, the comparator comprising:
    a first FET having an voltage input at a first FET gate terminal, said first FET having a first current terminal to receive a supply voltage wherein the voltage input at the first FET gate terminal is uncoupled from a gate terminal of the second FET;
    a first diode connected FET connected to a second current terminal of said first FET in series, said first FET and said first diode-connected FET forming a first circuit leg;
    a second diode connected FET having a connection for receiving said supply voltage; and
    a second FET having a first current terminal coupled to said second diode connected FET in series, the second FET and second diode connected FET forming a second circuit leg, said second circuit leg connected to said first circuit leg in parallel and forming a parallel circuit, said first FET and said second FET being approximately equal in size and forming a differential pair via said parallel circuit.

12. The integrated circuit of claim 11, further comprising:
    a current source circuit connected in series with said first circuit leg and said second circuit leg.

13. The integrated circuit of claim 12, wherein said current source circuit comprises a component selected from the group of: a temperature controlled resistor, a diode, a diode connected FET, a diode connected depletion type p-channel MOSFET, and a bi-polar junction transistor (BJT).

14. The circuit of claim 11, wherein said comparator has a trip point voltage above said supply voltage.

15. The integrated circuit of claim 12, wherein said current source circuit comprises:
    a depletion type MOSFET connected in series with a temperature controlled resistor, said depletion type MOSFET having a temperature coefficient opposite to a resistor temperature coefficient of said temperature controlled resistor, and wherein said temperature controlled resistor is an n-well resistor.

16. The integrated circuit of claim 12, wherein said first diode connected FET and said second diode connected FET are depletion type p-channel MOSFETs.

17. The integrated circuit of claim 14, further comprising:
    a trimmed precision reference voltage circuit connected to a gate terminal of said second FET for providing a reference voltage thereto.

18. An electronic device comprising the integrated circuit of claim 11, wherein the electronic device further comprises:
    an external connector having an external device identification pin connected to said first FET gate terminal of said first FET.

19. A method of fabricating a comparator circuit on an integrated circuit comprising:

providing a first field effect transistor (FET) having a voltage input at a first FET gate terminal, said first FET having a first current terminal to receive a supply voltage;

providing a first offset voltage circuit connected to a second current terminal of said first FET in series, said first FET and said first offset voltage circuit forming a first circuit leg;

providing a second offset voltage circuit having a connection for said supply voltage; and providing a second FET having a first current terminal coupled to said second offset voltage circuit in series, the second FET and second offset voltage circuit forming a second circuit leg, said second circuit leg connected to said first circuit leg in parallel and forming a parallel circuit, said first FET and said second FET being approximately equal in size and forming a differential pair via said parallel circuit.

20. The method of claim 19, wherein said first FET and said second FET are n-channel MOSFETS and wherein said first offset voltage circuit and said second offset voltage circuit are diode connected p-channel MOSFETS.

* * * * *